US011200940B2

(12) United States Patent
Prabhat et al.

(10) Patent No.: US 11,200,940 B2
(45) Date of Patent: Dec. 14, 2021

(54) DEVICES AND METHODS TO STORE AN INITIALIZATION STATE

(71) Applicant: Arm Limited, Cambridge (GB)

(72) Inventors: Pranay Prabhat, Cambridge (GB); James Edward Myers, Bottisham (GB); Graham Peter Knight, Cambridge (GB)

(73) Assignee: Arm Limited, Cambridge (GB)

( * ) Notice: Subject to any disclaimer, the term of this patent is extended or adjusted under 35 U.S.C. 154(b) by 0 days.

(21) Appl. No.: 16/683,192

(22) Filed: Nov. 13, 2019

(65) Prior Publication Data

US 2021/0142839 A1 May 13, 2021

(51) Int. Cl.
| | |
|---|---|
| *G11C 7/02* | (2006.01) |
| *G11C 11/4072* | (2006.01) |
| *G11C 11/408* | (2006.01) |
| *G11C 7/10* | (2006.01) |
| *G11C 7/22* | (2006.01) |
| *G11C 11/4094* | (2006.01) |

(52) U.S. Cl.
CPC ........ *G11C 11/4072* (2013.01); *G11C 7/1087* (2013.01); *G11C 7/222* (2013.01); *G11C 11/4085* (2013.01); *G11C 11/4094* (2013.01)

(58) Field of Classification Search
CPC .................................................. G11C 11/4072
USPC ............................................. 365/154, 210.12
See application file for complete search history.

(56) References Cited

U.S. PATENT DOCUMENTS

| | | | | |
|---|---|---|---|---|
| 5,325,325 | A * | 6/1994 | Azuma ................. | G11C 11/419 365/149 |
| 2007/0263461 | A1* | 11/2007 | Choi .................... | G11C 11/4078 365/196 |
| 2011/0261632 | A1* | 10/2011 | Clinton ................. | G11C 11/413 365/189.14 |

* cited by examiner

*Primary Examiner* — Hoai V Ho
(74) *Attorney, Agent, or Firm* — Pramudji Law Group PLLC; Ari Pramudji

(57) ABSTRACT

According to one implementation of the present disclosure, a memory array to block read-access of uninitialized memory locations is disclosed. The memory array includes: a plurality of memory cells apportioned into a plurality of memory columns and a plurality of memory rows, where each of the memory cells is configured to store a single bit of memory data; and one or more initialization columns corresponding to at least one of the plurality of memory columns. The initialization state of a memory row of the memory cells may be configured to be stored in: the memory row; a latch of word-line driver circuitry coupled to the memory array; or a memory cell of the one or more initialization columns of a corresponding row of the plurality of memory rows of the memory array.

20 Claims, 5 Drawing Sheets

DEVICES AND METHODS TO STORE AN INITIALIZATION STATE

I. FIELD

The present disclosure is generally related to devices and methods to store an initialization state.

II. DESCRIPTION OF RELATED ART

Advances in technology have resulted in smaller and more powerful computing devices. For example, a variety of portable personal computing devices, including wireless telephones, such as mobile and smart phones, tablets and laptop computers are small, lightweight, and easily carried by users. These devices can communicate voice and data packets over wireless networks. Further, many such devices incorporate additional functionality, such as a digital still camera, a digital video camera, a digital recorder, and an audio file player. Also, such devices can process executable instructions, including software applications, such as a web browser application, that can be used to access the Internet. As such, these devices can include significant computing and networking capabilities. Along with such capabilities, data stored in these devices may be vulnerable to security lapses.

Generally, in microprocessor and microcontroller system-on-chips (SoCs), confidential (secret) data is stored in embedded memory. Often, a program may go through various different phases that may be separated by shutdown or sleep periods. However, it is desirable that secret data, from a particular phase of execution would not be accessible by software in a succeeding execution phase. In one convention approach, to prevent undesired access of such confidential data, a programmer may clear the secret data before the program enters sleep mode or shutdown. Nevertheless, doing so would add latency as well as an energy penalty. Moreover, such an approach may be prone to error as it would require a programmer to clear every word of confidential data in memory. In another conventional approach, a programmer may power cycle the memories. However, power-cycling may not work for non-volatile memories (NVMs) and can be overcome using remanence attacks (e.g., by refrigerating the device under attack to increase memory data remanence time) for volatile memories. Accordingly, due to these drawbacks, the capacity to protect confidential data from data leakage and/or susceptibility to malicious software is an ongoing need in the art.

III. BRIEF DESCRIPTION OF THE DRAWINGS

The present technique(s) will be described further, by way of example, with reference to embodiments thereof as illustrated in the accompanying drawings. It should be understood, however, that the accompanying drawings illustrate only the various implementations described herein and are not meant to limit the scope of various techniques, methods, systems, circuits or apparatuses described herein.

Figure 1:
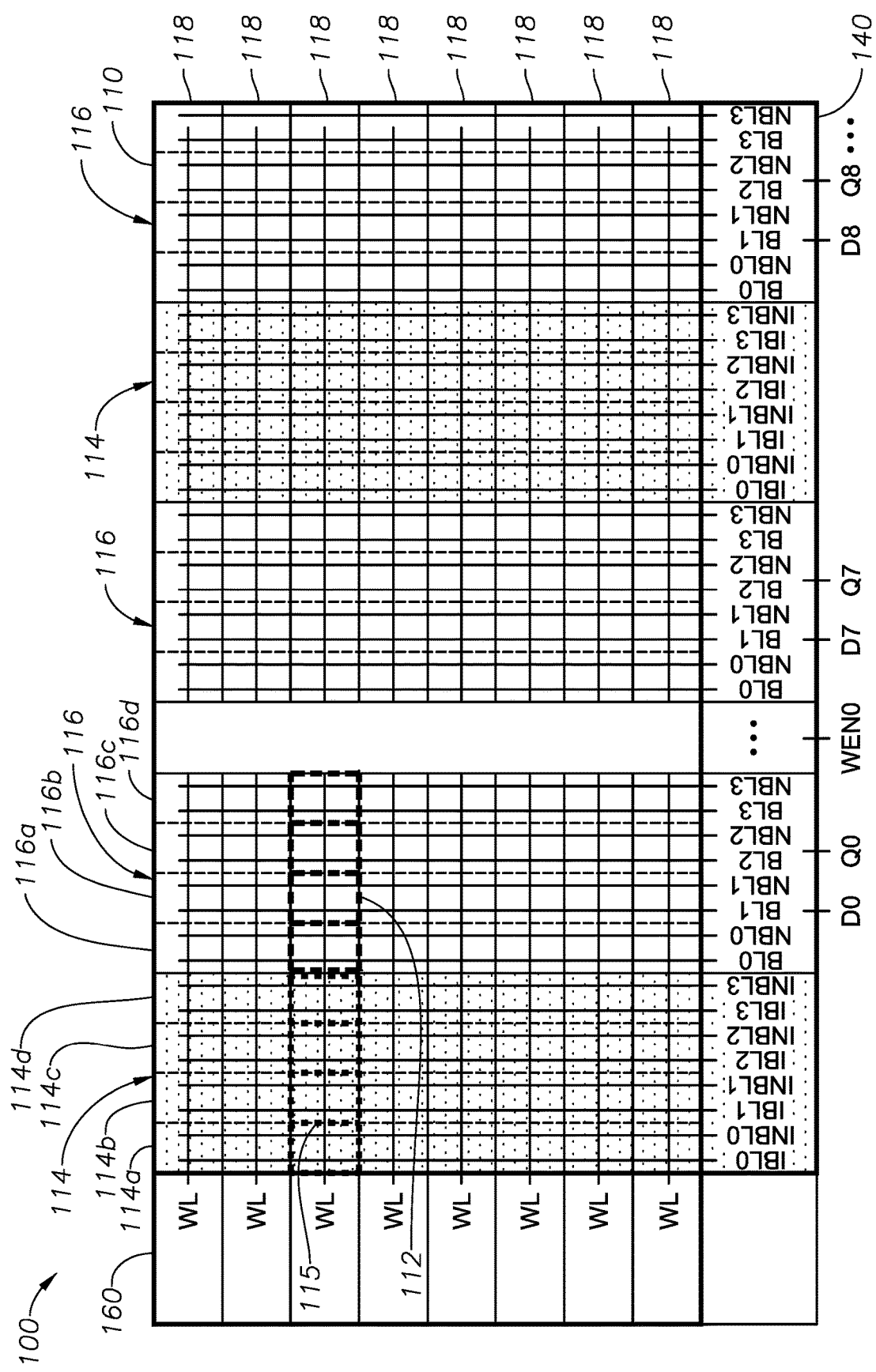
FIG. 1 is a schematic diagram of a memory macro section of an integrated circuit in accordance with various implementations described herein.

Reference is made in the following detailed description to accompanying drawings, which form a part hereof, wherein like numerals may designate like parts throughout that are corresponding and/or analogous. It will be appreciated that the figures have not necessarily been drawn to scale, such as for simplicity and/or clarity of illustration. For example, dimensions of some aspects may be exaggerated relative to others. Further, it is to be understood that other embodiments may be utilized. Furthermore, structural and/or other changes may be made without departing from claimed subject matter. References throughout this specification to "claimed subject matter" refer to subject matter intended to be covered by one or more claims, or any portion thereof, and are not necessarily intended to refer to a complete claim set, to a particular combination of claim sets (e.g., method claims, apparatus claims, etc.), or to a particular claim. It should also be noted that directions and/or references, for example, such as up, down, top, bottom, and so on, may be used to facilitate discussion of drawings and are not intended to restrict application of claimed subject matter. Therefore, the following detailed description is not to be taken to limit claimed subject matter and/or equivalents.

IV. DETAILED DESCRIPTION

Particular implementations of the present disclosure are described below with reference to the drawings. In the description, common features are designated by common reference numbers throughout the drawings.

Advantageously, inventive aspects of the present invention involve devices and methods to provide for the automatic "locking" of memories once such memories "come out" of either a shut down or a sleep mode. Upon locking, the exemplary circuit devices and methods would disallow (i.e., block) read operations from any uninitialized memory locations (i.e., memory locations that have not been previously written to in a current execution phase). Hence, by doing so, data leakage may be prevented from one execution phase to another. Moreover, such data security may be achieved automatically through hardware alone, without software configurations and/or monitoring of the central processing unit (CPU).

In certain exemplary aspects, hardware schemes and techniques to prevent uninitialized access from one phase of program execution to another are provided. Advantageously, such schemes and techniques are autonomous and software-agnostic, with low power, performance, area (PPA) overhead.

In one example scenario, a particular threat model includes: a first execution phase, a shutdown period, and a second execution phase. In the first execution phase, as the software is secure, memory may be written with confidential data. Next, in a subsequent shutdown phase, memory data may be either accidentally (due to programmer oversight) or maliciously (physical refrigeration attack) retained. Moreover, in the second execution phase, insecure/malicious software may attempt to read access of uninitialized data stored in memory. If circuits and methods according to the inventive aspects are implemented during this second execution phase, no confidential data form the first execution phase may be accessed.

In certain implementations, for example, the inventive aspects prevent/block unauthorized read access by allowing read access solely when it is detected that an initialization bit of an initialization column (corresponding to stored memory address) is set to a "1" data value. If the initialization bit is set to a "1" data value, read access would be granted. In operation, an initialization state of "1" would signify that since the last reset, in the current phase, a value has in fact been written to the initialization bit's corresponding memory address. However, if a "0" data value is detected for the initialization bit, then read access would be denied since a "0" data value as an initialization state would signify that no previous data was written in the current phase to the initialization bit's corresponding memory address. In this manner, in a particular operation, if a user/programmer "writes in" data, the user/programmer can "read out" such data in the same phase. However, if a user/programmer writes in data in one phase, and then the system goes through a reset, the user/programmer cannot read the data.

Figure 5:
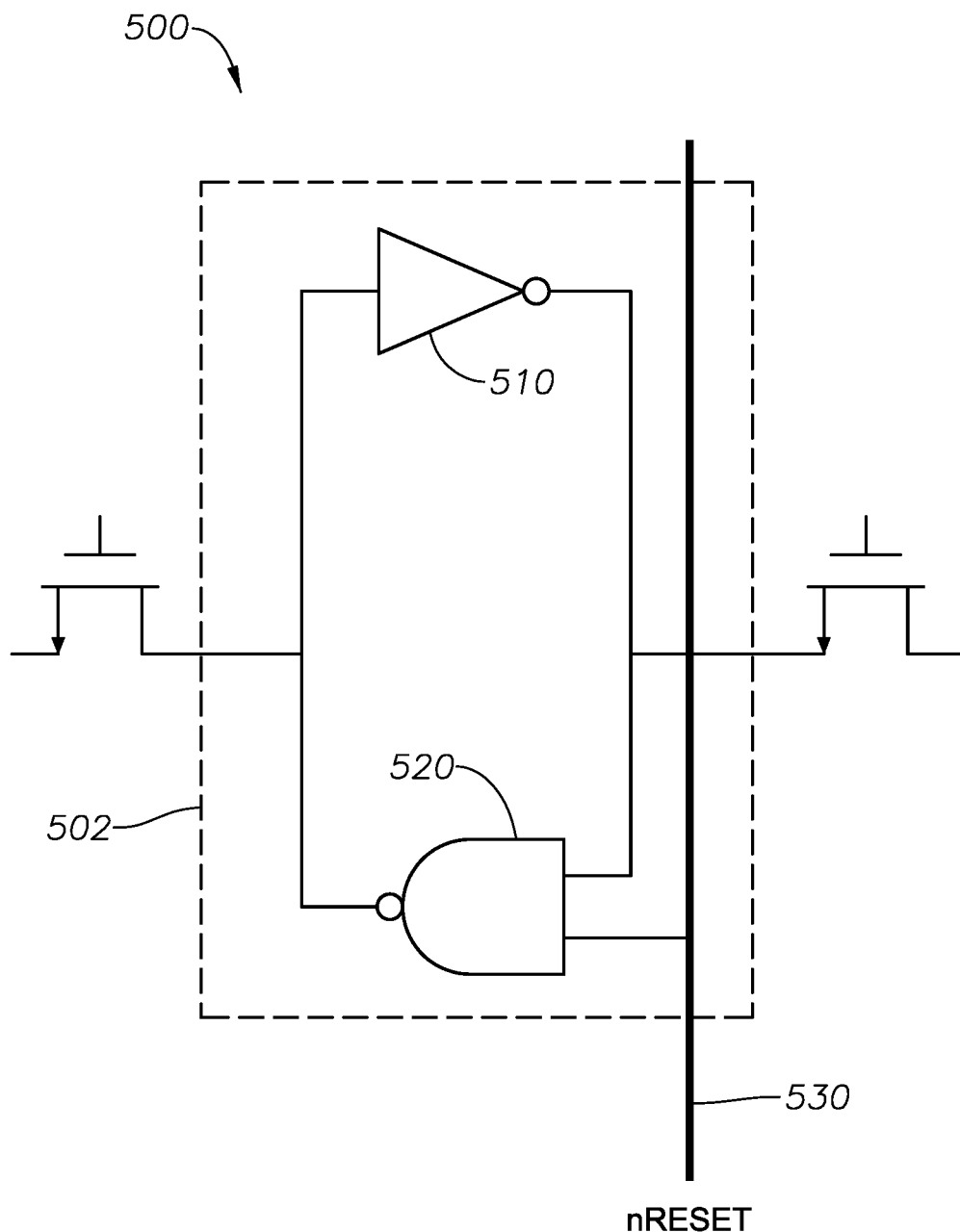
FIG. 5 is a schematic diagram of a memory bit-cell in accordance with various implementations described herein.

As a further benefit, in one particular implementation, a proposed solution for controlled resetting of all initialization state bits in a single cycle is also described (with reference to FIG. 5). Moreover, in one inventive aspect, methods may be implemented to prevent data-leakage from one phase of program execution to another.

Advantageously, such inventive schemes and techniques (as described herein) may be applicable to all embedded memories (e.g., 8-transistor-register file (8T-RF) (static-random access memory (SRAM), two-port SRAM, dual-port SRAMs, multi-port SRAMs, content addressable memories (CAMs), ternary content addressable memories (TCAMs). In various implementations, the inventive schemes and techniques can be implemented with memories including read/write-capable bit-cells for storing data and a memory array structure having a shared horizontal word-line and a shared vertical bit-line.

Referring to FIG. 1, a portion (i.e., a memory macro, a memory section) of an example integrated circuit 100 (e.g., a system-on chip (SoC)) is shown. As depicted in FIG. 1, the integrated circuit 100 includes a memory array 110 (i.e., a bit-cell array (e.g., 6-transistor (6T)-SRAM bit-cell), read/write circuitry 140, and word-line driver circuitry 160 among other circuit elements (not shown). In certain implementations, the memory array 110 may be apportioned in a plurality of memory data columns 116 (i.e., memory data input/output (I/O) columns), a plurality of memory data rows 118, and one or more initialization columns (i.e., initialization I/O columns, replicated columns) 114.

As illustrated in FIG. 1, the memory array 110 may include the plurality of memory data cells 112 (i.e., memory cells) and initialization state cells 115 (i.e., initialization state bit-cells, initialization state bits). Accordingly, the plurality of memory cells 112 may be apportioned into the plurality of memory columns 116, the plurality of memory rows 118, while the initialization state cells 115 may be apportioned into the one or more initialization columns 114. In various implementations, each of the memory cells 112 may be configured to store a single bit of memory data of a logic address, while each of the initialization state cells 115 may be configured to store an initialization state corresponding to the particular logical address. Accordingly, in certain implementations, the initialization state cells 115 store the locked or unlocked status of certain or all memory cells 112 of the memory array 110. Moreover, as shown in FIG. 1, each of the one or more initialization columns 114 may correspond to one or more respective memory data columns of the plurality of memory data columns 116.

The memory array 110 may be comprised of data memory bit-cells 112 (i.e., cells, memory units, memory locations, memory addresses), where each bit-cell includes one bit of data (e.g., a digital "1" or "0"). Moreover, each cell 112 may be coupled to two bit-lines (i.e., first and second bit-lines (BL and NBL), vertical wire lines) connecting each of data memory bit-cells 112 in the particular memory data column 116 to the read/write circuitry 140. Further, each row (of the plurality of memory rows 118) may include a word-line (WL) (horizontal wire line) connecting each of the bit-cells 112 to the word-line driver circuitry 160. Also, an initialization state (e.g., a digital "1" or "0") of a particular memory row (of the plurality of memory rows 118) of the memory cells 112 can be configured to be stored in the particular memory row, a particular latch of word-line driver circuitry coupled to the memory array 110, or a particular memory cell (i.e., a memory location, a memory bit) of the one or more initialization columns 114 of a corresponding row of the plurality of memory rows 118.

The read/write circuitry 140 may include: respective read driver circuitry (e.g., as shown as 410 in FIG. 4) and respective write driver circuitry (e.g., as shown as 200, 250 in FIGS. 2A-2B) for each of the plurality of memory data columns 116; and respective read driver circuitry (e.g., as shown as 410 in FIG. 4) and respective initialization column write driver circuitry (e.g., as shown as 300, 350 in FIGS. 3A-3B) for each of the one or more initialization columns 114. In certain example operations, the read/write circuitry 140 may provide: read and write operations for each of the memory cells 112 via each of the first and second bit-lines (BL, NBL); and read and write operations for each the initialization state cells 115 via each of the first and second initialization bit-lines (IBL, INBL).

The word-line driver circuitry 160 may be coupled to the memory array 110 and may be configured to drive/select a particular word-line (WL) coupled to the one or more memory cells 112 (e.g., a particular memory column and memory row). The memory macro of the integrated circuit 100 in FIG. 1 further includes "D" input lines and "Q" output lines coupled to the read/write circuity 140 and memory array 110. In one particular example, for a 32-bit word, the integrated circuit 100 would include 32 inputs from D0-D32 and 32 outputs from Q0-Q32.

As further shown in FIG. 1, in one implementation, each of the initialization columns 114 and each of memory columns 116 may include four memory cells (e.g., bit-cell, 4-bit cell) in each physical row to support four-column multiplexing (i.e., 4-way column multiplexing) (e.g., as one particular value for multiplexing) to reduce four array bits to one data I/O bit. Accordingly, based on the example of FIG. 1 as shown, for four-column multiplexing, respective four first bit-lines (i.e., BL[0-3]) and respective second bit-lines (i.e., NBL[0-3]) are coupled from each of the four bit-cells of the respective rows of memory cells 112 (i.e., bit-cells) in each I/O column. Moreover, with reference to FIG. 1, an initialization column 114 (including four initialization state memory addresses/row sub-unit columns 114(a-d)) may be identical to an adjacent memory column 116 (including four memory bit-cells sub-unit columns 116(a-d)). In various other implementations, any different number of columns (i.e., values of columns) may be utilized for column multiplexing.

In one example, advantageously, the memory macro of the integrated circuit 100 in FIG. 1 can be configured to support a byte-write feature by allowing write operations for a quarter of a 32-bit word. To do so, as shown in FIG. 1, such a byte-write operation would be controlled by a write enable pin bus (e.g., WEN0) for each eight data memory columns 116. Accordingly, for a 32-bit word, four write enable pins (i.e., WEN[0-3], four-bit write enable bus) may be used. Moreover, to support such a byte-write feature as part of the inventive schemes as described herein, an "extra" initialization column 114 may be included for every eight data memory columns 116. Hence, such extra initialization columns 114 would store initialization states corresponding to the memory addresses of the data memory columns 116. Consequently, when there is a write operation to a particular memory address (i.e., memory cell 112) of the memory array 110, a bit corresponding to that memory address in the initialization column 114 would be "set" (i.e. set equal to a data value of "1"). For example, the corresponding bit in the initialization column 114 may be a "matching" bit-cell to that of data memory column 116 (e.g., 114a and 116a). Also, once the bit of initialization column 114 is set, it is "sticky," such that subsequent accesses of the data memory columns 116 would not change the data value of the particular initialization column bit-cell (until it has been formally reset.)

In other examples (not shown), the memory macro of the integrated circuit can be configured in different implementations with initialization column granularity ranging from one initialization I/O column 114 per memory data I/O column 116 (i.e., 1 to 1) to one initialization column I/O column 114 for the whole array (i.e., 1 to 32), or in steps of one initialization I/O column to 2, 4, and 16 memory data I/O column groupings as well. In such examples, in different circuit implementations, each bit-cell of the initialization column is configured to store an initialization state of a corresponding row (in one of either 1, 2, 4, 16, or 32 column groupings) of the memory array 110.

Figure 2A:
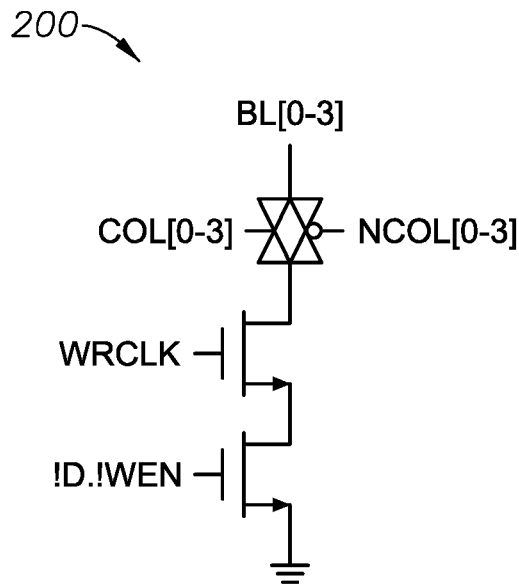
FIGS. 2A-2B are schematic diagrams of write driver circuitry in accordance with various implementations described herein.
Figure 2B:
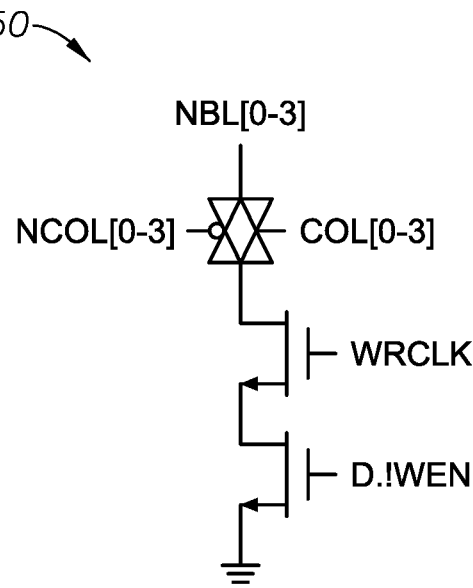

Referring to FIGS. 2A-2B, example write driver circuits 200, 250 for the first and second bit-lines (BL, NBL) implementable with the example memory macro portion of FIG. 1 are shown. For instance, respective write driver circuits 200, 250 may be implemented within the read/write circuitry 140 for each I/O column of the plurality of memory data columns 116 of the memory array 110. As shown in FIG. 2A, an example write driver circuit 200 is depicted for the first bit-lines (BL[0-3]) in an example four-bit per physical row memory data column (i.e., I/O memory column). Also, in FIG. 2B, an example write driver circuit is depicted for the second bit-lines (NBL[0-3]) in an example four-bit per physical row memory data column 116. In an example write operation, the respective write drive circuits 200, 250 may be configured to "pull down" (allowing data write) on either the first and second bit-lines (BL[0-3], NBL[0-3]) to particular bit-cells based on an incoming data signal (i.e., D, either digital data "0" or "1"), a write enable setting (i.e., WEN), a clock signal (i.e., WRCLK), and a particular column address (e.g., COL[0-3], NCOL[0-3]).

Figure 3A:
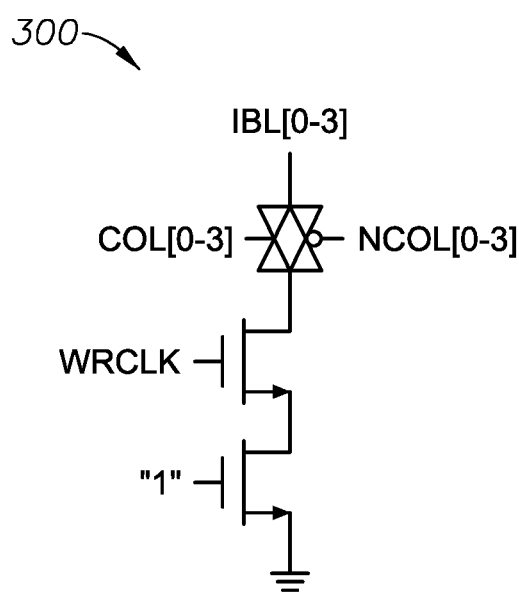
FIGS. 3A-3B are schematic diagrams of initialization column write driver circuitry in accordance with various implementations described herein.
Figure 3B:
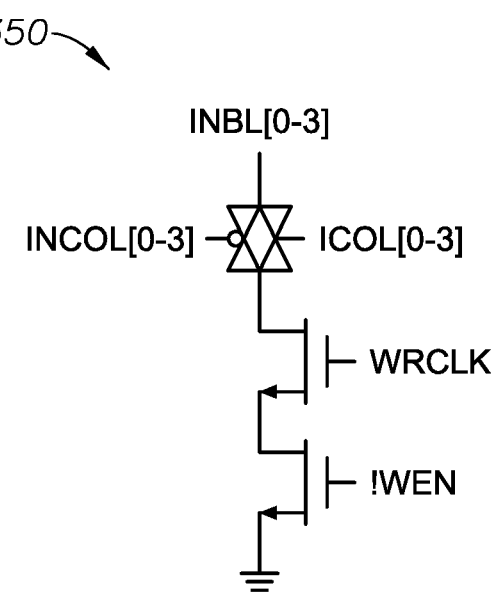

Referring to FIGS. 3A-3B, example initialization column write driver circuits 300, 350 for the first and second initialization bit-lines (IBL, INBL) implementable with the example memory macro portion of FIG. 1 are shown. For instance, respective initialization column write driver circuits 300, 350 may be implemented within the initialization read/write circuitry 140 for each of the memory columns 116 of the memory array 110. As shown, in FIG. 3A, an example initialization column write driver circuit 300 is depicted for the first initialization bit-lines (IBL[0-4]) in an example four-bit per physical row memory data column (IBL[0-3]).

Also, in FIG. 2B, an example initialization column write driver circuit is depicted for the second initialization bit-lines (INBL[0-4]) in an example four-bit per physical row memory data column (i.e., I/O column). In an example initialization write operation, respective one or more initialization column write driver circuits 300, 350 may be coupled to the one or more initialization columns 114 and may be configured to set (i.e., write) an initialization bit for the one or more initialization columns 114 based on the one or more written memory rows 118. In certain examples, to do so, the respective one or more initialization write circuits may be configured to transmit the initialization bit (i.e., set the initialization bit to a "1" data value) based on the first and second initialization bit-lines (IBL[0-3], INBL[0-3]) on an incoming data signal (i.e., D, data fixed to the value "1"), a write enable setting (i.e., WEN), a clock signal (WRCLK), and a particular initialization column address (e.g., INCOL [0-3], ICOL[0-3]).

Figure 4:
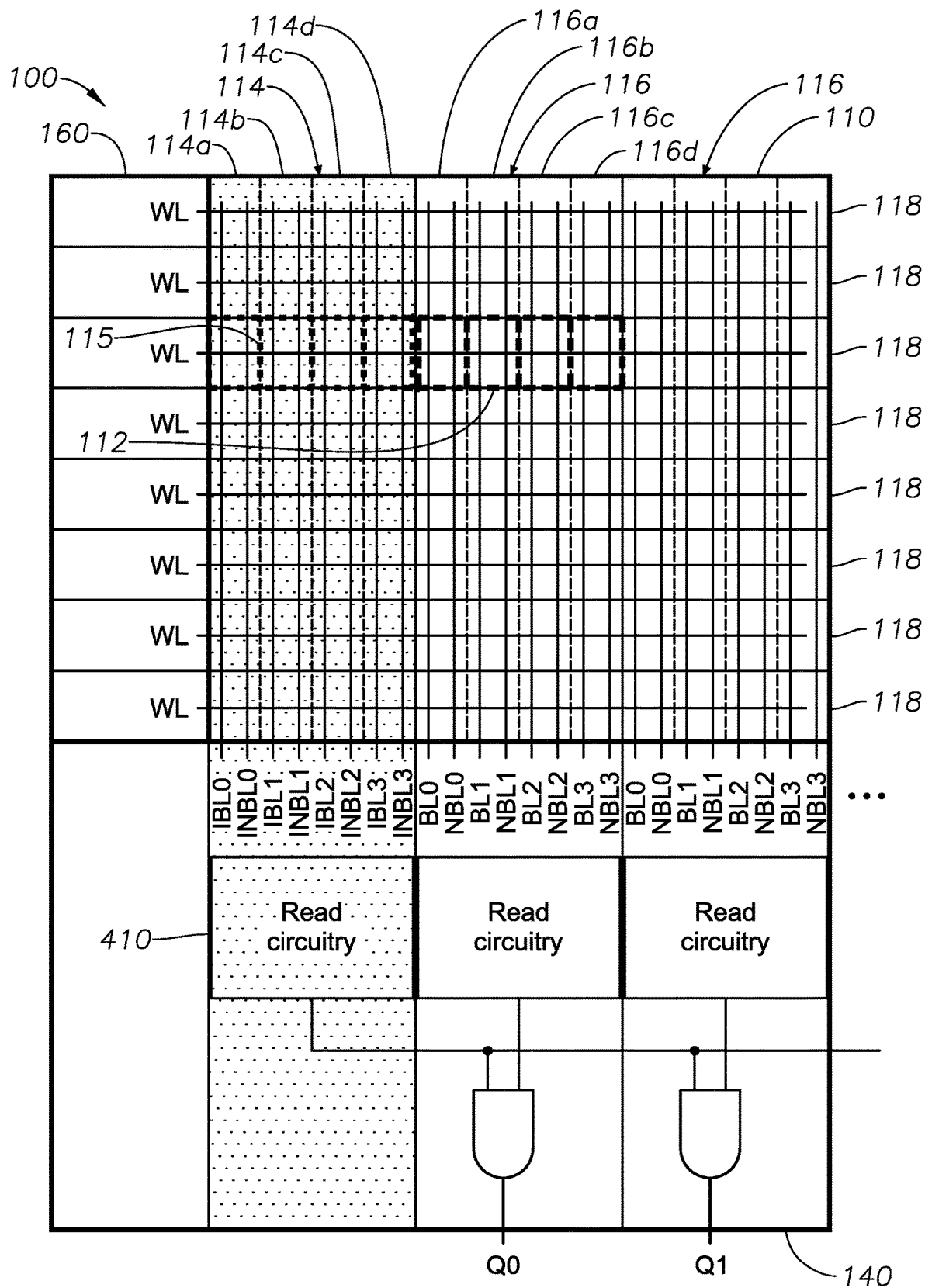
FIG. 4 is a schematic diagram of a memory macro section of an integrated circuit in accordance with various implementations described herein.

Referring to FIG. 4, example read circuitry 410 (i.e., read driver circuits) implementable with the example memory macro portion of FIG. 1 is shown. In certain implementations, respective read driver circuits 410 of the read/write circuitry 140 may be coupled to each of the one or more memory columns 116 and one or more initialization columns 114. Further, each of the one or more memory columns 116 and one or more initialization columns 114 may be configured for concurrent read operations. For instance, in such read operations when a 16-bit or 32-bit data word is read, the corresponding initialization bit may be concurrently read. Accordingly, if this initialization bit is "unset" (i.e., never been written to, and hence, a data "0") then the initialization bit via the read driver circuit 140 may be configured to "clamp" one or more read data outputs (e.g., Q0, Q1, etc.) to a "0" data value. Hence, the read data would not appear at the output, but rather just "0's" would be output. On the other hand, if the initialization bit is "set" (such that a previous write to the initialization bit has occurred), then the read/write driver circuitry 140 is configured to permit data signals (i.e., the data would be permitted to propagate) to the read data outputs (e.g., Q0, Q1, etc.).

Moreover, during operation, a process to reset all of the initialization state bits in a single cycle would be desired. In doing so, the memory can be "locked" upon system wakeup by a standard system reset pulse with no additional pulse extension. Hence, during the system wakeup, each of the initialization column state bits 115 should be uninitialized (i.e., having a digital "0" value), otherwise upon the wakeup, the initialization column would include random state values. Also, it would be further desired to have the capacity to control such a reset process at will. Hence, a programmer or user would be able to identify that a particular phase is now over and therefore, from this point forward, each of the initialization bits should be locked. However, such an objective cannot be achieved through the write driver circuitry 200, 250, as the write driver circuitry 200, 250 may only access one word per cycle. Thus, one would have to write to each initialization bit-cell sequentially, which would be inefficient. Consequently, one alternative would be to assert all of the word-lines and column select lines of the bit-cells to concurrently write a digital "0" to each bit-cell of the initialization column 114. Nevertheless, this alternative would incur a significant peak current and power penalty. Hence, according to the inventive aspects, one proposed bit-cell for controlled resetting of all initialization state bits in a single cycle is described with reference to FIG. 5.

Referring to FIG. 5, an example bit-cell 500 implementable as an example initialization bit-cell 115 of the example memory macro portion of FIG. 1 is shown. As illustrated, in one implementation, the example bit-cell 500 may be a resettable 6-transistor (6T) SRAM bit-cell. As shown in FIG. 5, the resettable 6T-SRAM bit-cell may include a modified central cross-cross coupled inverter latch 502 (i.e., latch), where a first input of a NAND gate 520 may be coupled to a respective reset wire 530 (i.e., nRESET input line) (that is further coupled to the read/write circuitry 140), while a second input of the NAND gate 520 is an output of an inverter 510 of the latch 502. Advantageously, by doing so, the example bit-cell 500 allows for a reset capacity as shown. Also, while in some instances an area cost may be incurred by the bit-cell 500 as the bit-cell 500 is designed as a logic rules bit-cell, such cost may be confined solely to the particular additional initialization column 114.

In certain examples, each of the one or more memory data columns 116 may include a respective reset wire 530. Moreover, the reset wire 530 may be a separate vertical wire parallel to the first and second bit-lines (BL, NBL). In one particular instance, the nRESET input may be derived from system nRESET, CPU power state (e.g., SLEEPING output on Cortex-M cores), or a combination thereof, such that the macro nRESET may be pulsed to lock the memories whenever the system wakes up. In other implementations, the example bit-cell 500 may include similar NAND gate modification to the central cross-coupled inverter latch of the bit-cells and modifications to the read/write circuitry.

In other schemes and techniques of the inventive aspects as described in FIGS. 1-5, other circuit implementations are also envisioned. In one example, the initialization state may be stored in a standard memory cell 112 or in custom-drawn latches or flip-flops of the word line driver circuity 160. Moreover, to reduce area overhead in the byte-write scenario, a single initialization state column 114 can be used, while the initialization bit may be pessimistically set solely when a word write occurs. Also, the inventive aspects may use a combination of this macro section and other standard macros to reduce power, performance, area (PPA) constraints. In such aspects, the programmer/designer would likely have to ensure that all confidential data is confined to the locked memory macro.

Figure 6:
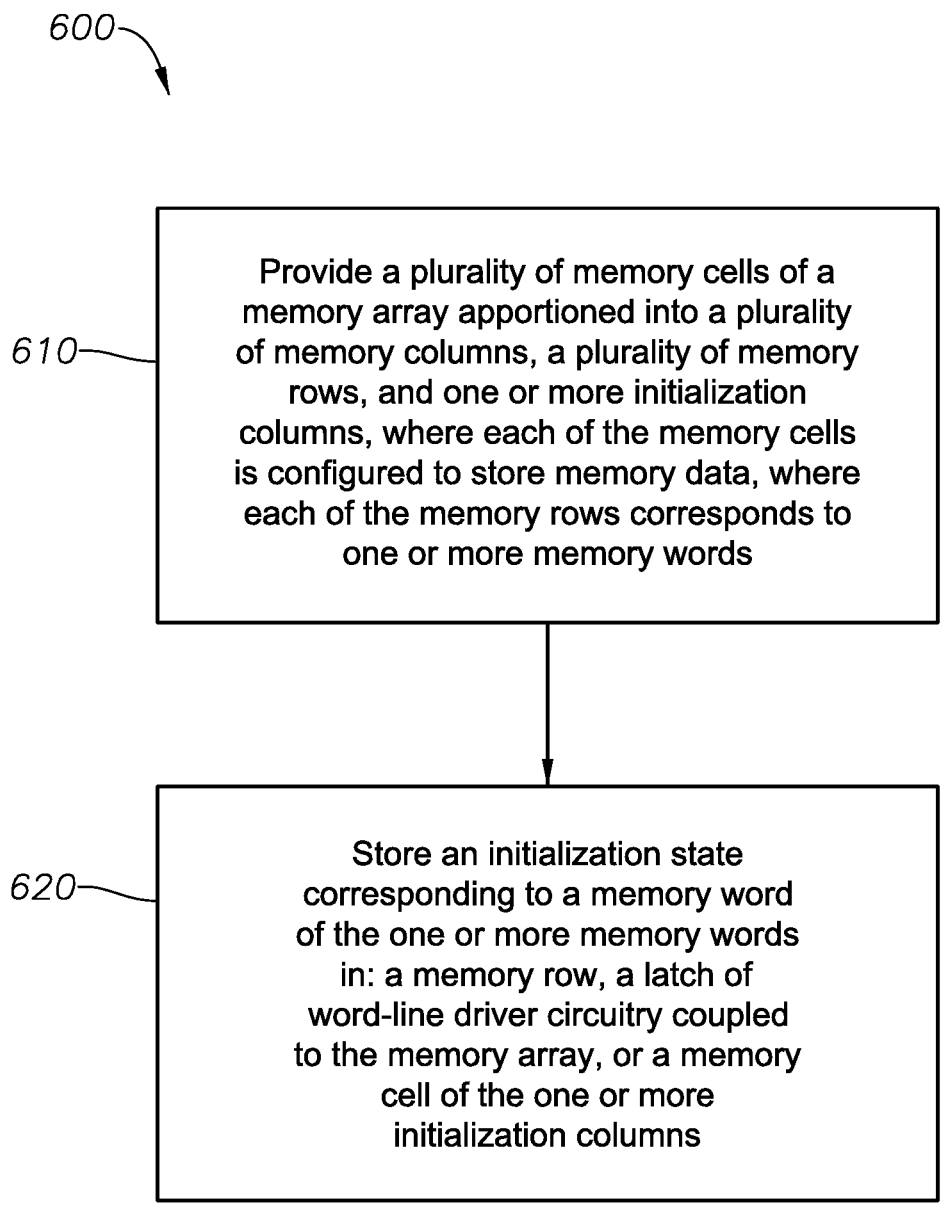
FIG. 6 is a flowchart of a particular illustrative aspect of methods in accordance with various implementations described herein.

Referring to FIG. 6, an example method 600 (i.e., method 600) applicable for an example operation implementable upon the integrated circuit 100 of FIG. 1 is shown. The method 600 may be used: to prevent data-leakage from one phase of program execution to another; to prevent uninitialized memory read operations; to "lock" memory as it comes out of either shutdown or sleep modes; and to prevent data reads for any memory location not written in a current execution phase.

At block 610, a plurality of memory cells of a memory array apportioned into a plurality of memory columns, a plurality of memory rows, and one or more initialization columns may be provided. Also, each of the memory cells may be configured to store a single bit of memory data, and each of the memory rows corresponds to one or more memory words (e.g., 16-bit or 32-bit) memory words. For example, with reference to FIGS. 1-5, a plurality of memory cells 112 of a memory array 110 apportioned into a plurality of memory data columns 116, a plurality of memory rows 118, and one or more initialization columns 114 may be provided.

At block 620, an initialization state corresponding to a memory word of the one or more memory words may be stored in: a particular memory row, a particular latch of word-line driver circuitry coupled to the memory array; or a memory cell (i.e., memory location, memory bit) of one or more initialization columns of a corresponding row of the plurality of memory rows of the memory array. For example, with reference to FIGS. 1-5, an initialization state corresponding to a memory word of the one or more memory words may be stored in: a particular memory row 118, a particular latch of word-line driver circuitry 160 coupled to the memory array 110; or a memory cell 115 (i.e., initialization state bit, memory location, memory bit) of the one or more initialization columns 114 (of a corresponding row (i.e., each of the memory addresses) of the plurality of memory rows 118 of the memory array 110).

In certain implementations, the example method 600 may include additional blocks. For example, in additional or alternative blocks, in a single memory cycle, the initialization state corresponding to the memory word of the one or more memory words may be reset. For example, with reference to FIGS. 1-5, the initialization state (i.e., initialization state bit 115) corresponding to the memory word (e.g., corresponding to memory cells 112 of a particular memory row 118) of the one or more memory words may be reset (by a respective reset wire 530).

According to one implementation of the present disclosure, a memory array to store an initialization state to block read-access of uninitialized memory locations is disclosed. The memory array includes: a plurality of memory cells apportioned into a plurality of memory columns and a plurality of memory rows, where each of the memory cells is configured to store a single bit of memory data; and one or more initialization columns corresponding to at least one of the plurality of memory columns. The initialization state of a memory row of the memory cells may be configured to be stored in: the memory row; a particular latch of word-line driver circuitry coupled to the memory array; or a memory cell of the one or more initialization columns of a corresponding row of the plurality of memory rows of the memory array.

In one aspect, each of the plurality of memory cells may be coupled to a first and second bit-line, where the first and second bit-lines are controlled by read/write circuitry coupled to the memory array.

In a second aspect, each of the one or more initialization columns may include four memory cells in each physical row.

In a third aspect, each row of the plurality of memory rows may be coupled to a word-line.

In a fourth aspect, the memory array may include one initialization column for the plurality of memory columns.

In a fifth aspect, the memory array may include one initialization column for one of: each memory column of the plurality of memory columns, every two memory columns of the plurality of memory columns, every four memory columns of the plurality of memory columns, every eight memory columns of the plurality of memory columns or every sixteen memory columns of the plurality of memory columns.

In a sixth aspect, each bit-cell of the initialization column may be configured to store an initialization state of a corresponding row of the memory array.

In a seventh aspect, respective write driver circuits may be coupled to the one or more memory rows, where the respective write driver circuits may be configured to write data to the one or more memory rows.

In an eighth aspect, the respective write driver circuits may be configured to transmit memory data based on an incoming data signal, a write enable setting, a clock signal, and a particular column address.

In a ninth aspect, respective one or more initialization column write driver circuits may be coupled to the one or more initialization columns, where the one or more initialization column write driver circuits may be configured to set an initialization bit for the one or more initialization columns based on the one or more written memory rows.

In a tenth aspect, the respective one or more initialization column write driver circuits may be configured to transmit the initialization bit based on an incoming data signal, a write enable setting, a clock signal, and an initialization column address.

In an eleventh aspect, respective read driver circuits may be coupled to each of the one or more memory columns and one or more initialization columns, where each of the one or more memory columns and one or more initialization columns may be configured for concurrent read operations.

In a twelfth aspect, the read driver circuits may be configured to clamp one or more read data outputs to a "0" data value when an initialization bit is unset, and where the read/write driver circuitry may be configured to permit data signals read data outputs when an initialization bit is set.

In a thirteenth aspect, each of the memory cells may include a resettable memory cell configured to reset initialization bits in a memory cycle, where each of the resettable memory cells may include a NAND gate coupled to a respective reset wire, where the respective reset wire may be coupled to read and write circuitry, and where each of the one or more memory columns may include the respective reset wire.

According to one implementation of the present disclosure, a method to prevent data-leakage from one phase of program execution to another is disclosed. The method includes: (1) providing a plurality of memory cells of a memory array apportioned into a plurality of memory columns, a plurality of memory rows, and one or more initialization columns, where each of the memory cells is configured to store a single bit of memory data, where each of the memory rows corresponds to one or more memory words; and (2) storing an initialization state corresponding to a memory word of the one or more memory words in: a particular memory row, a particular latch of word-line driver circuitry coupled to the memory array; or a memory of the one or more initialization columns (of a corresponding row of the plurality of memory rows of the memory array).

In one aspect, the method includes resetting, in a single memory cycle, the initialization state corresponding to the memory word of the one or more memory words.

According to one implementation of the present disclosure, an integrated circuit to store an initialization state is disclosed. The integrated circuit includes: a memory array apportioned into a plurality of memory columns, a plurality of memory rows, and one or more initialization columns, where each of the memory cells is configured to store (a single bit of) memory data; word-line driver circuitry coupled to the memory array and configured to select a particular word-line coupled to one or more memory cells. Also, an initialization state corresponding to the memory data (e.g., a memory word) may be configured to be stored in: a particular memory row of the plurality of memory rows; a particular latch of the word-line driver circuitry coupled to the memory array; or a memory cell of one or more initialization columns (e.g., corresponding to a particular row of the plurality of memory rows of the memory array).

In a first aspect, the integrated circuit further may include respective read driver circuitry and write driver circuitry for each of the plurality of memory columns and respective read driver circuitry and respective initialization column write driver circuitry for the one or more initialization columns.

In a second aspect, the respective write driver circuitries may be configured to transmit memory data based on an incoming data signal, a write enable setting, a clock signal, and a column address, and where the respective initialization column write circuitries may be configured to transmit the initialization bit based on an incoming data signal, a write enable setting, a clock signal, and an initialization column address.

In a third aspect, the respective read driver circuitries may be configured to clamp one or more read data outputs to a "0" data value when an initialization bit is unset, and where the read/write driver circuitries may be configured to permit data signals read data outputs when an initialization bit is set.

In example implementations, certain circuit elements have been provided in FIGS. 1-6, whose redundant description has not been duplicated in the related description of analogous circuit elements herein. It is expressly incorporated that the same circuit elements with identical symbols and/or reference numerals are included in each of embodiments based on its corresponding figure(s).

Although one or more of FIGS. 1-6 may illustrate systems, apparatuses, or methods according to the teachings of the disclosure, the disclosure is not limited to these illustrated systems, apparatuses, or methods. One or more functions or components of any of FIGS. 1-6 as illustrated or described herein may be combined with one or more other portions of another of FIGS. 1-6. Accordingly, no single implementation described herein should be construed as limiting and implementations of the disclosure may be suitably combined without departing form the teachings of the disclosure.

The flowchart and block diagrams in the Figures illustrate the architecture, functionality, and operation of possible implementations of systems and methods according to various implementations of the present disclosure. In this regard, each block in the flowchart or block diagrams may represent a module, segment, or portion of instructions, which comprises one or more executable instructions for implementing the specified logical function(s). In some alternative implementations, the functions noted in a block in a diagram may occur out of the order noted in the figures. For example, two blocks shown in succession may be executed substantially concurrently, or the blocks may sometimes be executed in the reverse order, depending upon the functionality involved. It will also be noted that each block of the block diagrams and/or flowcharts, and combinations of blocks in the block diagrams and/or flowcharts, can be implemented by special purpose hardware-based systems that perform the specified functions or acts or carry out combinations of special purpose hardware and computer instructions.

In the following description, numerous specific details are set forth to provide a thorough understanding of the disclosed concepts, which may be practiced without some or all of these particulars. In other instances, details of known devices and/or processes have been omitted to avoid unnecessarily obscuring the disclosure. While some concepts will be described in conjunction with specific examples, it will be understood that these examples are not intended to be limiting.

Unless otherwise indicated, the terms "first", "second", etc. are used herein merely as labels, and are not intended to impose ordinal, positional, or hierarchical requirements on the items to which these terms refer. Moreover, reference to, e.g., a "second" item does not require or preclude the existence of, e.g., a "first" or lower-numbered item, and/or, e.g., a "third" or higher-numbered item.

Reference herein to "one example" means that one or more feature, structure, or characteristic described in connection with the example is included in at least one implementation. The phrase "one example" in various places in the specification may or may not be referring to the same example.

Those of skill would further appreciate that the various illustrative logical blocks, configurations, modules, circuits, and algorithm steps described in connection with the implementations disclosed herein may be implemented as electronic hardware, computer software executed by a processor, or combinations of both. Various illustrative components, blocks, configurations, modules, circuits, and steps have been described above generally in terms of their functionality. Whether such functionality is implemented as hardware or processor executable instructions depends upon the particular application and design constraints imposed on the overall system. Skilled artisans may implement the described functionality in varying ways for each particular application, but such implementation decisions should not be interpreted as causing a departure from the scope of the present disclosure.

The steps of a method or algorithm described in connection with the disclosure herein may be implemented directly in hardware, in a software module executed by a processor, or in a combination of the two. A software module may reside in random access memory (RAM), flash memory, read-only memory (ROM), programmable read-only memory (PROM), erasable programmable read-only memory (EPROM), electrically erasable programmable read-only memory (EEPROM), registers, hard disk, a removable disk, a compact disc read-only memory (CD-ROM), or any other form of non-transient storage medium known in the art. An exemplary storage medium is coupled to the processor such that the processor can read information from, and write information to, the storage medium. In the alternative, the storage medium may be integral to the processor. The processor and the storage medium may reside in an application-specific integrated circuit (ASIC). The ASIC may reside in a computing device or a user terminal. In the alternative, the processor and the storage medium may reside as discrete components in a computing device or user terminal.

The previous description is provided to enable a person skilled in the art to make or use the disclosed implementations. Various modifications to these implementations will be readily apparent to those skilled in the art, and the principles defined herein may be applied to other implementations without departing from the scope of the disclosure. Thus, the present disclosure is not intended to be limited to the implementations shown herein but is to be accorded the widest scope possible consistent with the principles and novel features as defined by the following claims.

What is claimed is:

1. A memory array comprising:
    a plurality of memory cells apportioned into a plurality of memory columns and a plurality of memory rows, wherein each of the memory cells is configured to store memory data; and
    one or more initialization columns corresponding to at least one of the plurality of memory columns,
    wherein an initialization state of a memory row of the memory cells is configured to:
        prevent unauthorized read access; and
        be stored in:
            the memory row;
            or
            a memory cell of the one or more initialization columns of a corresponding row of the plurality of memory rows of the memory array.

2. The memory array of claim 1, wherein each of the plurality of memory cells is coupled to a first and second bit-line, and wherein the first and second bit-lines are controlled by read/write circuitry coupled to the memory array.

3. The memory array of claim 1, wherein each of the one or more initialization columns comprises four memory cells in each physical row.

4. The memory array of claim 1, wherein each row of the plurality of memory rows is coupled to a word-line.

5. The memory array of claim 1, wherein the memory array comprises one initialization column for the plurality of memory columns.

6. The memory array of claim 1, wherein the memory array comprises one initialization column for one of: each memory column of the plurality of memory columns, every two memory columns of the plurality of memory columns, every four memory columns of the plurality of memory columns, every eight memory columns of the plurality of memory columns or every sixteen memory columns of the plurality of memory columns.

7. The memory array of claim 1, wherein each bit-cell of the initialization column is configured to store an initialization state of a corresponding row of the memory array.

8. The memory array of claim 1, wherein respective write driver circuits are coupled to the one or more memory rows, and wherein the respective write driver circuits are configured to write data to the one or more memory rows.

9. The memory array of claim 8, wherein the respective write driver circuits are configured to transmit memory data based on an incoming data signal, a write enable setting, a clock signal, and a column address.

10. The memory array of claim 9, wherein respective one or more initialization column write driver circuits are coupled to the one or more initialization columns, and wherein the one or more initialization column write driver circuits are configured to set an initialization bit for the one or more initialization columns based on the one or more written memory rows.

11. The memory array of claim 10, wherein the respective one or more initialization column write driver circuits are configured to transmit the initialization bit based on an incoming data signal, a write enable setting, a clock signal, and an initialization column address.

12. The memory array of claim 1, wherein respective read driver circuits are coupled to each of the one or more memory columns and one or more initialization columns, wherein each of the one or more memory columns and one or more initialization columns are configured for concurrent read operations.

13. The memory array of claim 12, wherein the read driver circuits are configured to clamp one or more read data outputs to a "0" data value when an initialization bit is unset, and wherein the read/write driver circuitry are configured to permit data signals for read data outputs when an initialization bit is set.

14. The memory array of claim 1, wherein each of the memory cells comprises a resettable memory cell configured to reset initialization bits in a memory cycle, wherein each of the resettable memory cells comprises a NAND gate coupled to a respective reset wire, wherein the respective reset wire is coupled to read and write circuitry, and wherein each of the one or more memory columns comprises the respective reset wire.

15. A method comprising:
providing a plurality of memory cells of a memory array apportioned into a plurality of memory columns, a plurality of memory rows, and one or more initialization columns, wherein each of the memory cells is configured to store memory data, wherein each of the memory rows corresponds to one or more memory words; and
storing an initialization state configured to prevent unauthorized read access and corresponding to a memory word of the one or more memory words in: a memory row or a memory cell of the one or more initialization columns.

16. The method of claim 15, further comprising:
resetting, in a single memory cycle, the initialization state corresponding to the memory word of the one or more memory words.

17. An integrated circuit comprising:
a memory array apportioned into a plurality of memory columns, a plurality of memory rows, and one or more initialization columns, wherein each of the memory cells is configured to store memory data; and
word-line driver circuitry coupled to the memory array and configured to select a word-line coupled to one or more of the memory cells;
wherein an initialization state corresponding to the memory data is configured to:
prevent unauthorized read access; and
be stored in:
a memory row of the plurality of memory rows; or
a memory cell of the one or more initialization columns.

18. The integrated circuit of claim 17, further comprising:
read/write circuitry comprising respective read driver circuitry and write driver circuitry for each of the plurality of memory columns and respective read driver circuitry and respective initialization column write driver circuitry for the one or more initialization columns.

19. The integrated circuit of claim 18, wherein the respective write driver circuitries are configured to transmit memory data based on an incoming data signal, a write enable setting, a clock signal, and a column address, and wherein the respective initialization column write circuitries are configured to transmit the initialization bit based on an incoming data signal, a write enable setting, a clock signal, and an initialization column address.

20. The integrated circuit of claim 18, wherein the respective read driver circuitries are configured to clamp one or more read data outputs to a "0" data value when an initialization bit is unset, and wherein the read/write driver circuitries are configured to permit data signals for read data outputs when an initialization bit is set.

* * * * *